United States Patent [19]
Chang

[11] Patent Number: 5,916,642
[45] Date of Patent: Jun. 29, 1999

[54] METHOD OF ENCAPSULATING A MATERIAL IN A CARBON NANOTUBE

[75] Inventor: Robert P. H. Chang, Glenview, Ill.

[73] Assignee: Northwestern University, Evanston, Ill.

[21] Appl. No.: 08/754,545

[22] Filed: Nov. 21, 1996

Related U.S. Application Data

[60] Provisional application No. 60/007,455, Nov. 22, 1995.

[51] Int. Cl.$^6$ ............................... C23C 16/30; D01F 9/12
[52] U.S. Cl. ...................... 427/580; 164/46; 423/445 B; 423/447.3; 427/590; 427/249
[58] Field of Search ........................ 423/445 B, DIG. 39, 423/DIG. 40, 447.3; 204/157.47; 427/562, 580, 590, 249; 164/46

[56] References Cited

U.S. PATENT DOCUMENTS

| 5,346,683 | 9/1994 | Green et al. ........................... 423/447.2 |
| 5,456,986 | 10/1995 | Majetich et al. ..................... 423/445 R |
| 5,457,343 | 10/1995 | Ajayan et al. ........................ 423/447.2 |
| 5,482,601 | 1/1996 | Ohshima ................................. 204/173 |
| 5,543,378 | 8/1996 | Wang .................................. 423/445 B |

OTHER PUBLICATIONS

Lin, X., et al. "Large Scale Sythesis of Single–Shell Carbon Nanotubes", Applied Physics Letters, Jan. 10, 1994, vol. 64, p. 181.

Ando, Y. et. al., "Preparation of Carbon Nanotubes by Arc Discharge Evaporation", Jap. Journal of Applied Physics, Jan., 1993, vol. 132, pp. L107–L109.

Rinzler, A.G. et. al., "Unraveling Nanotubes: Field Emission from an Atomic Wire", Science, Sep. 15, 1995, vol. 1, pp. 1550–1553.

Kiang, C–H et al., Carbon Nanotubes with Single Carbon, Aug. 2, 1995, vol. 33, pp. 903–914.

Ajayan, P.M. et al., "Growth Morphologies during Cobalt–Catalyzed Single–Shell Carbon Nanotube Synthesis", Chemical Physics Letters, Dec. 10, 1993, vol. 215 pp. 509–517.

Le Heer Walt A. et al., "A Carbon Nanotube Field–Emission Electron Source," Science, vol. 270, Nov. 17,1995, pp. 1179–1180.

Wang, X.K. et al., "Carbon nanotubes synthesized in a hydrogen arc discharge", Appl. Phys Lett. vol. 69, May 1, 1995, pp. 2430–2432.

Service, Robert F., "Nanothubes Show Image–Display Talent" Science, vol. 275, Nov. 17, 1995, p. 1118.

X. K. Wang et al. "The effect of hydrogen on the formation of carbon nanotubes and fullerenes" J. Mater. Res. vol. 10, Aug. 1995, pp. 1977–1983.

Setlur, A.A. et al., "A method for synthesizing large quantities of carbon nanotubes and encapsulated nanowires" Appl. Phys. Letter, 69, Jul. 15, 1996, pp. 345–347.

Dai, J. Y. et al. "Synthesis of carbon–encapsulated nanowires using polycyclic aromatic hydro carbon precursors" Chemical Physics Letters, 258, Aug. 23, 1996, pp. 547–553.

Baker, R.T.K., et al. "Catalytic Growth of Carbon Nanofibers", from Materials Research Society Symposium proceedings vol. 349, Symposium held 1994, pp. 251–256 of proceedings, Apr. 1994.

*Primary Examiner*—Michael Lewis
*Assistant Examiner*—Peter DiMauro

[57] ABSTRACT

A method of encapsulating a material in a carbon nanotube comprising generating a vapor of the material to be encapsulated, generating a hydrogen arc discharge that discharges encapsulating products, and contacting the vapor of the material and the products discharged from the hydrogen arc discharge proximate a surface to encapsulate the material in a carbon nanotube. A carbon nanotube encapsulating a metallic material (e.g. copper), a semi-conductor material (e.g. germanium) and other materials can be produced.

16 Claims, 6 Drawing Sheets

METHOD OF ENCAPSULATING A MATERIAL IN A CARBON NANOTUBE

This application claims the benefits of U.S. Provisional Application Ser. No. 60/007,455 filed Nov. 22, 1995.

CONTRACTURAL ORIGIN OF THE INVENTION

The invention was made with Government support under Grant No DMR-9320520 awarded by the National Science Foundation. The Government may have certain rights in the invention.

FIELD OF THE INVENTION

The invention relates to a method of filling (encapsulating) a material, such as metal, semiconductor and the like, in a carbon nanotube using a hydrogen arc discharge, such nanotube encapsulated materials being of use as electron emitters in flat panel displays and as nanowires (sans nanotube) for electrical interconnects for integrated circuit chips.

BACKGROUND OF THE INVENTION

The helium arc discharge has been extensively used to produce carbon nanotubes also called buckytubes in macroscopic quantities. All experiments reported to date have shown that carbon nanotubes produced in inert gas arcs are invariably capped at the ends of the tubes The nanotube ends can be opened by a post oxidation treatment in an oyxgen atmposhere at high temperature. However, the tube ends become filled with carbonaceous debris. Thus, filling the open-ended tubes after post oxidation with other material has proven difficult. Another problem with carbon nanotubes sythesized in inert gas arcs is the formation of highly defective tubes containing amorphous carbon deposits on both the inside surface and outside surface of the tubes and the presence of discontinuous graphite sheets The nanotubes can be embedded in a background of amorphous carbon that glues the nanotubes together and makes their separation very difficult to near impossible. At present, there is a need to find a simple and effective method to synthesize high quality carbon nanotubes.

As the device dimensions for integrated circuits approach submicron scale, there is a need to synthesize and process materials with special composition and geometry at the nanoscale level for application both in electronics and optics It is anticipated that these capablities will launch a nanotechnology with applications that currently do not exist. For example, there is a need in the future flat panel area to fabricate surface electron emtters with over 300,000 emission sites in an area less than ten microns square. At best, the current technology can only reach one hundredth of the emission site-density needed.

SUMMARY OF THE INVENTION

The present invention provides a method of making nanoscale wires with typical outer diameters in the range of 1 to 500 nanometers (nm), and bundles of these wires with density up to a million in each bundle. The present invention also provides in an embodiment a method of encapsulating a material in a carbon based (e.g. graphite) nanotube having nanoscale diameter dimensions comprising generating a vapor of the material to be encapsulated, generating a hydrogen arc discharge that discharges encapsulating products, and contacting the vapor of the material and the products discharged from said hydrogen arc discharge proximate a surface to encapsulate the material in a carbon based nanotube. A nanotube encapsulating a metallic material, such as copper, a semiconductor material, such as germanium, and other materials can be produced.

A method embodiment of the invention forms a nanotube by generating a vapor of a first material, generating a second tube-forming material, contacting the vapor of the first material and the second tube-forming material, and forming a nanotube of the second material in-situ about the first material. Preferably, the vapor of the first material and the tube-forming material are generated in a hydrogen bearing atmosphere having a hydrogen pressure effective to promote in-situ nanotube formation.

The present invention further provides a nanotube comprising a material formed as a tubular body in-situ about another material preferably in a hydrogen bearing atmosphere. The first material typically is carbon based (e.g graphite) and the second material can comprise a metal or semiconductor material.

DESCRIPTION OF THE DRAWINGS

FIG. 1 shows a typical TEM image of a bundle of carbon based (e.g. graphite) nanotubes mostly filled with copper using a hydrogen arc operating at hydrogen pressure of 500 Torr pursuant to the invention. Electron diffraction indicates that there is crystalline copper in the nanotubes wherein FIG. 1A is an electron diffraction pattern of the copper material in the nanotube of FIG. 1.

DESCRIPTION OF INVENTION

The present invention provides a method of making carbon nanotubes having typical nanoscale inner or outer tube diameters of 1 to 500 nanometers depending on the number of layers of carbon based material (e.g. graphite) forming the tube wall and encapsulating a material such as a metal, semiconductor and other materials in a one-step manner using a hydrogen atmosphere. More typically, the inner or outer diameter of the nanotubes can be in the range of 5 to 30 nanometers. The nanotubes are considered nanoscale in terms of their diameter dimensions and can be considerably greater in their length dimension, such as for example only several microns in length dimension. The present invention provides a method of encapsulating a material in a carbon nanotube comprising generating a vapor of the material to be encapsulated, generating encapsulating products such as in a hydrogen arc discharge that discharges encapsulating products, such as sub-micron graphite sheets, and contacting the vapor of the material and the encapsulating products such as discharged from said hydrogen arc discharge proximate a surface to encapsulate the material in a carbon nanotube. Atomic hydrogen may be needed to extend the time at which the arc discharge products, such as sub-micron graphite sheets wrap around themselves to allow for the desired encapsulation. The method of the invention can produce "clean", open-ended carbon nanotubes with reduced amorphous carbon associated therewith and with higher yields encapsulating copper, germanium and other materials. The method also provides for fabrication of nano-wires in the same diameter range as well as bundles of these wires.

Figure 4:
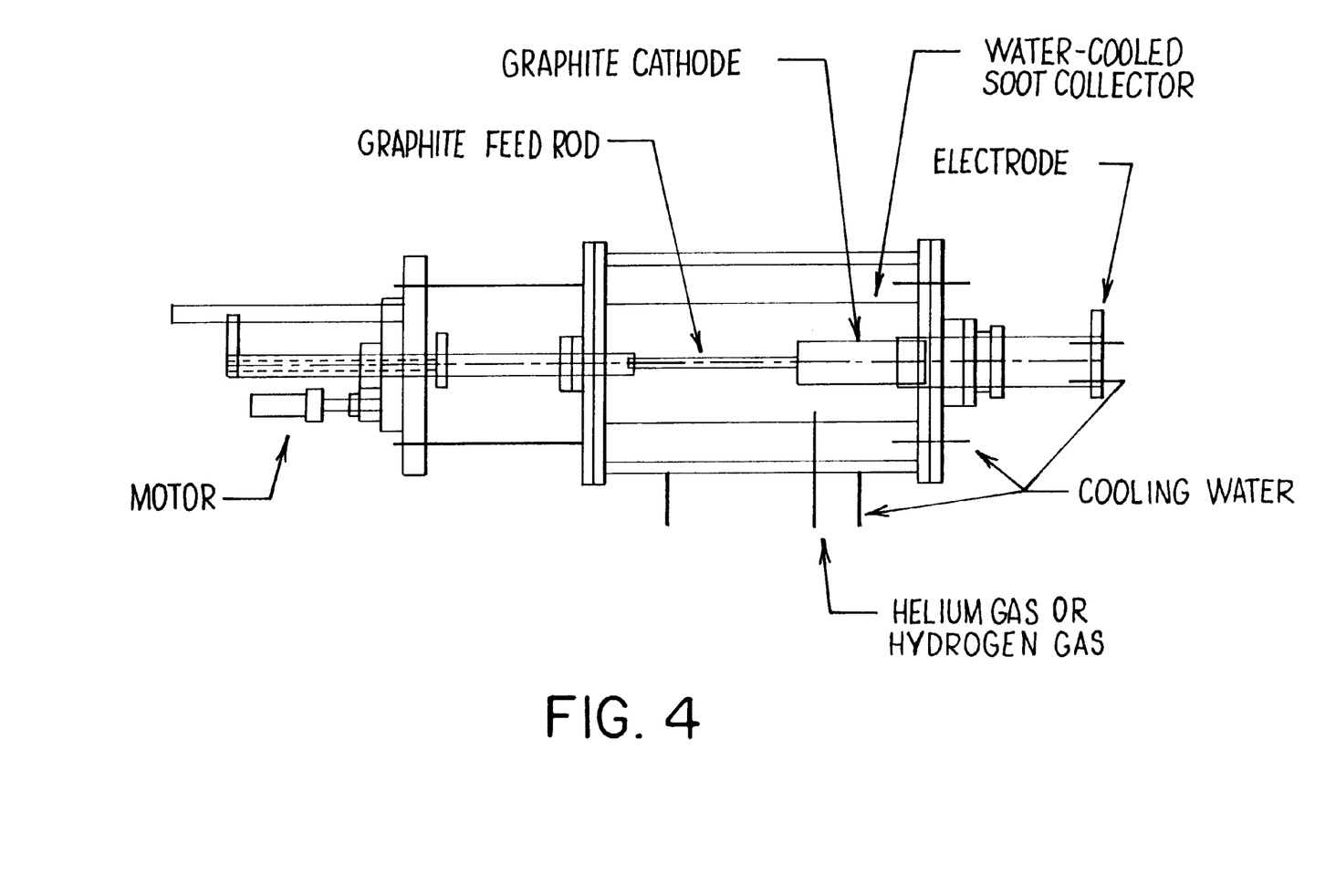
FIG. 4 is a schematic illustration of an arc system for practicing an embodiment of the invention.

The invention is practiced using a known arc system basically like that employed heretofore for the production of buckyballs and buckytubes and schematically illustrated in FIG. 4. An arc system of the type used is described by Wang et al. in *J. Mater. Res.*, 10, 1 (1995). The method of the intention is described below as practiced using two graphite rods as the electrodes (anode and cathode with carbon nanotubes forming at the lower temperature cathode) of the arc system. The rods can be the same or different in diameter as shown in FIG. 4, such as approximately 10 millimeters (mm) diameter each.

In the practice of the invention to encapsulate copper, a graphite electrode having a copper insert can be used as the anode and a graphite electrode used as the cathode. In the practice of the invention to encapsulate germanium, a graphite electrode having a germanium insert can be used as the anode and a graphite electrode used as the cathode. The filling materials can be any solid at room temperature.

The electrode or rods typically are spaced apart about 0.25 millimeter during conduct of the method using a hydrogen atmosphere, although the spacing can be in the range of about 0.25 millimeters to a few millimeters (e.g. about 2 millimeters). The electrical arc is generated by a DC current (100 Amp, about 20 V providng a current density, $J=150$ $A/cm_2$) in a hydrogen atmosphere at a pressure in the range of 50–500 Torr. The hydrogen can be pure, research grade hydrogen having a purity of 99.9% and better and flowing at about 30 standard cubic feet per minute (sccm), although the invention is not so limited and can be practiced using other grades of hydrogen.

The invention is practiced using a known source of filling or wire material to be fabricated. The nano-tubes need to be made of layered material such as graphite or boron nitride, for example. The invention uses sub-micron size sheets of the layered material to wrap the filling material thus in effect filling a nano-tube with a foreign material. If a wire of the material is needed then a method of selective etching of the filled nano-tube can be used to remove the tube, thus leaving behind the desried nano-wire.

In practice, the source of sub-micron layered material can be generated, for example, by an arc or using a source of polycylic aromatic hydrocarbons for nano-graphite layers. The filling material can be evaporated by thermal or electron beam, for example. The process can take place in the following way. Sear the source of sub-micron layered material, a source of charge is provided to charge the layered sheets so that they can be accelerated towards a collection plate. A voltage is applied between the source and the collection plate. Between the source of layered sheets and the collection plate, the environment is filled with atomic or molecular species of the filling material.

During flight between the source and the collection plate the layered sheets will interact with the filling species and wrap about them along the way or on the collection plate. The collection plate is at a temperature below the melting point or the sublimation temperature of the filling material and the tube material. This process can be performed in a vacuum chamber.

As an illustration of the invention, experiments have been conducted in a hydrogen arc. The operating parameters were as follows. The arc vacuum chamber was filled with research grade hydrogen to a pressure of 500 torr. The arc electrodes were graphite rods with ⅜₁", diameter. A hole was drilled into the anode graphite feed rod which hole was then filled with a ¼" diameter copper rod. The arc was run at 20 volts and 100 amps.

Stability of the arc was maintained by adjusting the electrode spacing varying from 0.25 to 2.0 mm in the hydrogen atmosphere using the motor shown. In this illustration, the graphite rod was the source of layered sheets, the copper was the filling material, and the arc provided a means of evaporating the copper to form atomic copper species and also a means of breaking the graphite layer into many sub-micron sheets. Both the vacuum chamber wall and the cathode served as the collection plate. The presence of atomic and molecular hydrogen species was thought to serve to terminate the dangling carbon bonds of the sub-micron graphite sheets, thus allowing the sheet to have time to wrap the filling materials. Unterminated sub-micron graphite sheets typically are energetically unstable; they curl around themselves. Examples of nanotubes filled with copper and germanium are shown in the attached drawings. To remove the graphite tubes and thus form nano-wires of copper or germanium, the graphite can be etched in an oxygen or hydrogen plasma atmosphere to remove it.

The temperature profile of the arc can be measured by an Accufiber M100 optical pyrometer available from Luxtron Corp., Beaverton, Oregon.

Figures 1, 1A:
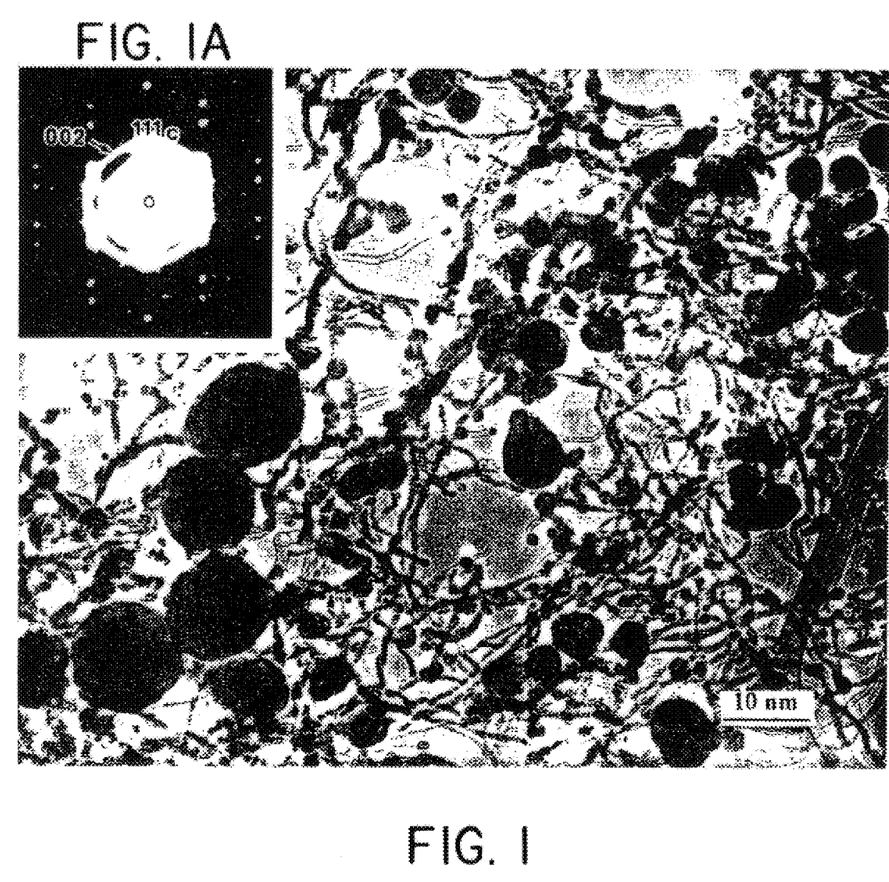

FIG. 1 shows a typical TEM image of a bundle of carbon nanotubes mostly filled with copper using a hydrogen arc operating at pressure of 500 Torr pursuant to the invention. The carbon nanotubes collect on the water cooled cathode. The electron diffraction pattern, FIG. 1A, indicates that there is crystalline copper in the tubes.

Figure 2A:
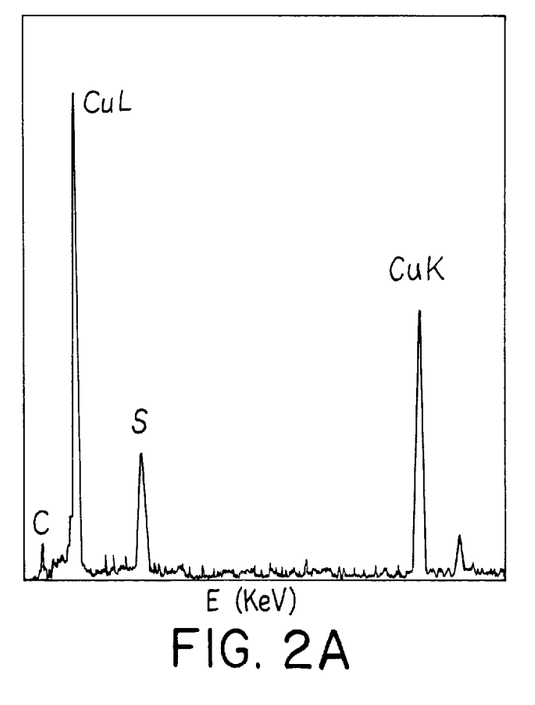
FIG. 2A is a graph illustrating electron-beam induced x-ray emission of a carbon nanotube filled with copper.
Figure 2B:
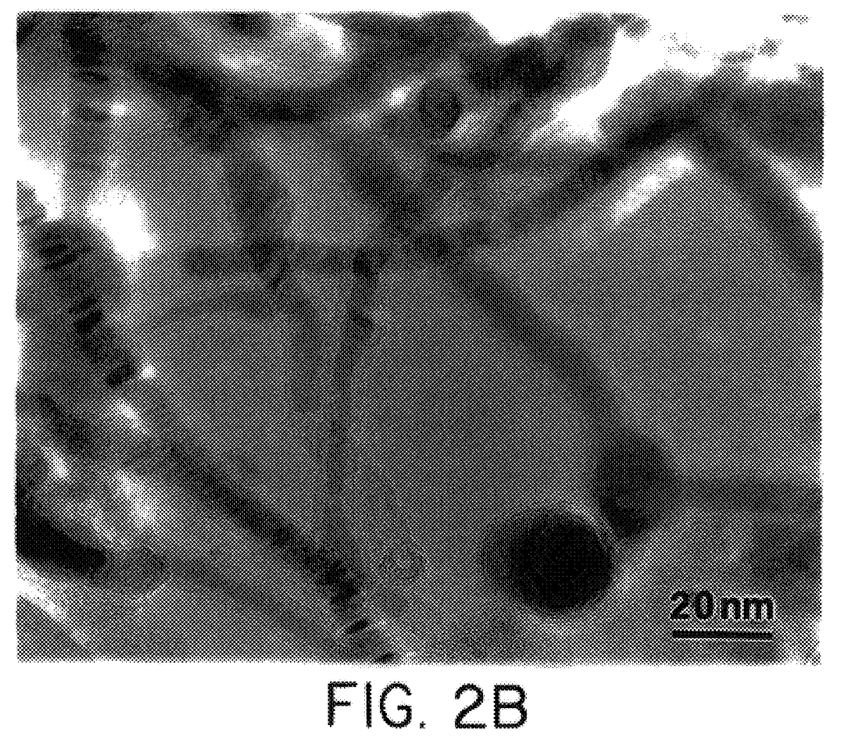
FIGS. 2B and 2C show a high magnification of carbon nanotubes having graphite layers/sheets forming the nanotube filled with crystalline copper. Electron beam induced x-ray emission, FIG. 2A, also confirms the presence of copper in the nanotubes.
Figure 2C:
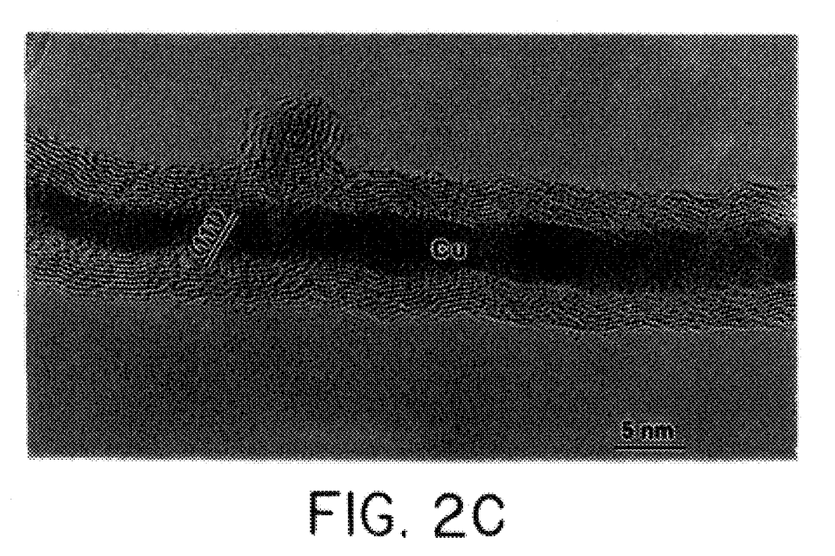

FIGS. 2B, 2C show a higher magnification of carbon nanotubes filled with crystalline copper pursuant to the invention. Electron beam induced x-ray emission, FIG. 2A, also confirms the presence of copper in the nanotubes.

Similar nanotubes filled with copper also were made using a graphite anode and cathode having equal approximately 10 nm diameters at a hydrogen pressure of 100 Torr and 500 Torr. The anode included a drilled hole or counterbore of 6 mm diameter and 2 centimeter (cm) depth in which a copper rod of similar dimensions was inserted. The hydrogen atmosphere was controlled at 100 or 500 Torr, and the arc was generated betweeen the anode and cathode at approximately 20 volts and 100 amps. Stability of the arc was maintained by adjusting the electrode spacing varying from 0.25 to 2.0 mm. The nanotubes with copper filler were collected on the water cooled cathode and soot collector, FIG. 4.

For the nanotubes formed in 500 Torr hydrogen pressure and collected on the cathode as leafy deposits, the deposited leaves had a rubbery texture. For the nanotubes formed in 100 Torr hydrogen pressure and collected on the cathode as leafy deposits, the deposited leaves had a harder texture. The deposited leaves formed at 500 Torr hydrogen pressure contained carbon nanotubes, many of which were filled with by copper. In 100 Torr hydrogen pressure, the deposited leaves generally had a lower yield of filled nanotubes as compared to filled nanotubes formed at at 500 Torr. Moreover, about 20 times more soot product was produced with copper/graphite composite anodes than with a graphite anode used heretofore to make buckyballs and buckytubes, and some of the soot particles had a copper luster to them.

Figure 5A:
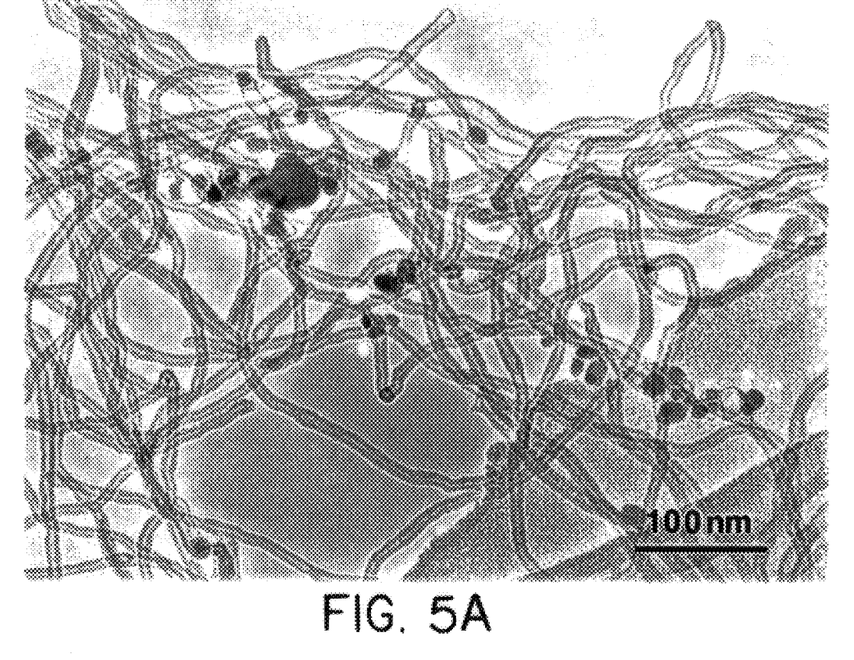
FIG. 5A is low magnification transmission electron micrograph (TEM) image of a portion of the soot formed at 500 Torr hydrogen pressure with a copper/graphite composite anode.

FIG. 5A is low magnification image of a portion of the soot collected at the soot collector, FIG. 4, at 500 Torr hydrogen pressure estimated through TEM observations to contain about 20% to 30% of nanotubes filled with copper. The soot for TEM examination was prepared by scraping appropriate regions of the soot collector and then dispersing the collected powder onto a holey carbon grid.

Figures 5B, 5C:
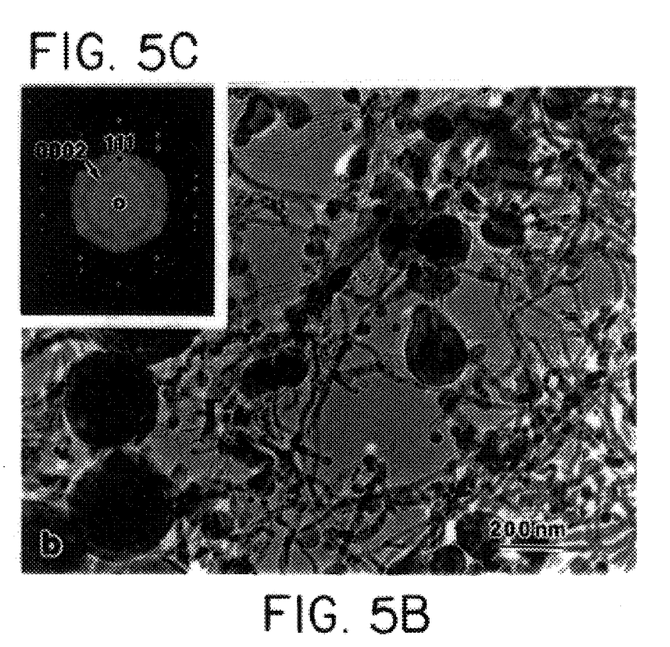
FIG. 5B is a TEM image of a copper rich region of the soot with many filled nanotubes.
FIG. 5C is a selected area x-ray diffraction pattern showing the presence of (111) twins of the copper filler and of (0002) graphite layer.

The soot was found to consist of long hollow carbon nanotubes as shown for example in FIG. 5A. FIG. 5B shows a copper rich region of the soot, which region includes filled nanotubes of copper, encapsulated copper nanocrystals, and larger copper crystals. In these regions, about 80% to 90% of the nanotubes are completely filled with copper. The selected area diffraction pattern, FIG. 5C, shows the presence of both cyrstalline copper [(111) twin] and graphitic layers ($d_{(0002)}$=0.34 nm). The copper in the nanotubes of FIG. 5A is polycrystalline with twins occurring in some nanotubes. The morphology of the soot is similar for the 100 and 500 Torr experiments conducted. The exterior of the nantubes is without any amorphous carbon coating, FIG. 2C, unlike the nanotubes produced heretofore by CCVD (catalytic chemical vapor deposition) type processes. When a helium atmosphere at 100 or 500 Torr was used in the arc chamber in lieu of the aforementioned hydrogen atmospshere, only fullerenes, copper nanoparticles, and amorphous carbon were found in the collected soot. The practice of the invention involves generating the electrical arc discharge in a hydrogen bearing atmosphere wherein the hydrogen is present at a pressure effective to form nantotubes partially and/or completely filled with a second material such as metal, semiconductor or other material. The hydrogen atmosphere preferably is present at a pressure of at least about 50 Torr to this end, although higher hydrogen pressures, such as 500 Torr, more generally below 760 Torr hydrogen, provide higher yields of partially or completely filled nanotubes. Mixtures of hydrogen and an inert gas, such as helium, may be used in the practice of the invention.

Figure 3A:
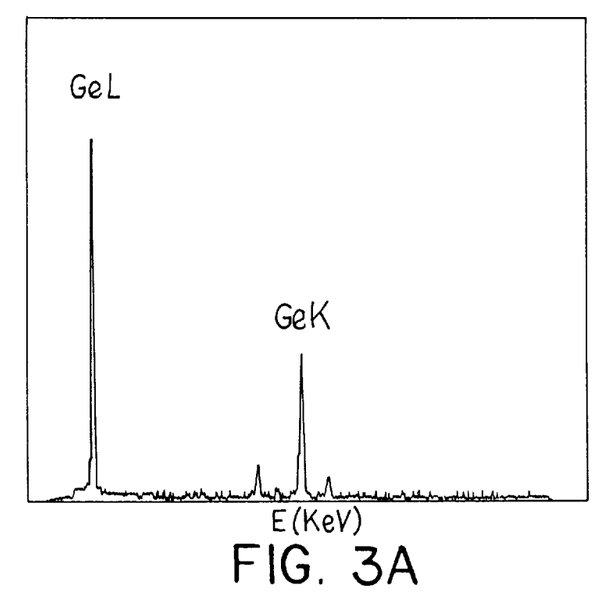
FIG. 3A is a local x-ray emission analysis of a nanotube filled with germanium.
Figure 3B:
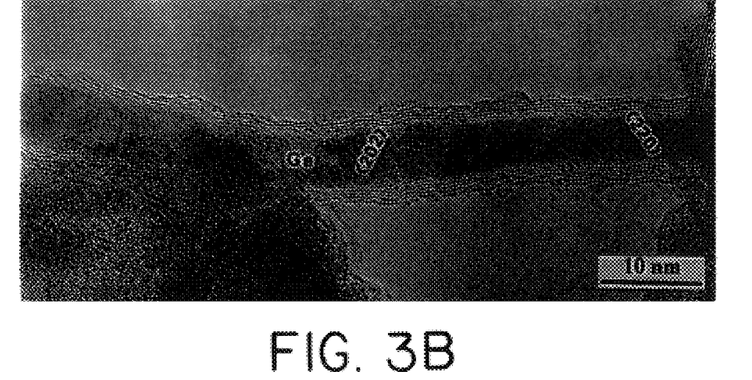
FIG. 3B and 3C show typical TEM images of carbon nanotubes filled with crystalline germanium.

FIG. 3B shows a typical TEM image of a carbon nanotube filled with crystalline germanium formed under conditions like those described above and collected on the water cooled cathode and soot collector, FIG. 4. The anode and cathode each had a diameter of approximately 10 nm with the anode having 100 mesh germanium powder disposed in a 6 mm diameter and 2 cm deep counterbore in the anode end. Local x-ray emission analysis, FIG. 3A, also verified that the tube was filled with germanium.

The overall yield of germanium filled nanotubes was generally lower than that of copper-filled nanotubes and was thought to be due to the reactivity of germanium with hydrogen, leading to gaseous products which were pumped out of the system, although Applicant does not wish or intend to be bound by any theory in this regard. The range of diameters of germanium filled carbon nanotubes was from 10–50 nm, FIGS. 3B and 3C, and no empty nanotubes were observed in the collected soot.

Figure 3C:
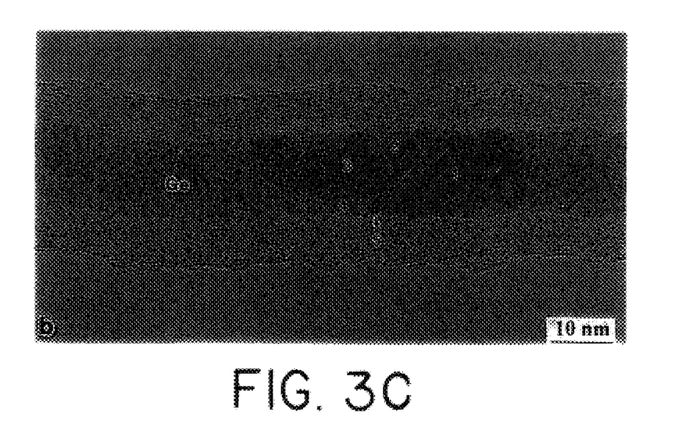
Figure 3D:
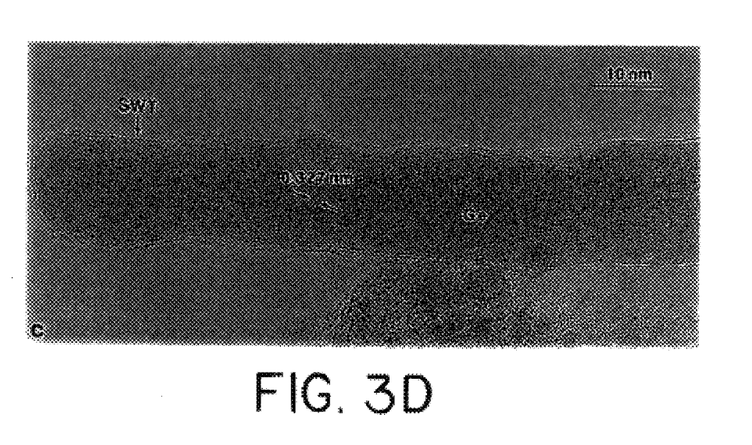
FIG. 3D is a high resolution electron micrograph showing a germanium nanowire encapsulated by a single layer of graphite, Local x-ray emission analysis, FIG. 3A, also verifies that the tube is filled with germanium.

The morphology of germainium filled nanotubes was observed to vary. For example, FIG. 3B shows a typical TEM image of a carbon nanotube filled with crystalline germanium formed under conditions like those described above. FIG. 3C shows a germanium filled nanotube having a polycrystalline filler material. The sharp contrast in the micrograph corresponds to microtwins or stacking faults on {111} closely packed atomic planes at angles of about 40 degrees and 70 degrees to the axis of the tube. There are regions indicated by 1–5 of five-fold twins often observed in fcc (face centered cubic) structures. FIG. 3D is a high resolution electron micrograph showing a nanowire encapsulated with a single graphite layer; i.e. an "amorphous-like" germanium nanowire encapsulated by a single wall tube showing frozen growth of the nanowire formed at same or different conditions, The germanium encapsulated by the single graphite layer was crystallized into extremely small crystals and comprised a minor proportion of the soot collected The germanium inside the tube had short range order, showing the character of 0.327 nm {111} atomic planes.

Again, when a helium atmosphere at 100 or 500 Torr was used in the arc chamber in lieu of the aforementioned hydrogen atmosphere, only fullerenes, germanium nanoparticles, and amorphous carbon were found in the soot collected.

The filled nanotubes of the invention can be used advantageously as electron emitters in flat panel displays for visual display devices, such a flat panel displays, and as nanowires (after the nanotube is removed) for electrical interconnects for connecting integrated circuit chips to outside devices or electronic components.

The present invention provides a method of producing in a hydrogen atmosphere large quantities of carbon nanotubes filled partially or completely with another material, such as a metal or semiconductor, and also encapsulated metal nanowires which nanowires can be freed by removing the encapsulating layer.

It will be understood that the above description of the invention is offered for purposes of illustration and that various modifications, changes and adaptions can be made therein, and that the same are intended to be comprehended within the scope of the appended claims.

I claim:

1. A method of encapsulating a material in a nanotube comprising vaporizing the material to be encapsulated, vaporizing a material comprising carbon in the presence of at least 50 Torr of molecular hydrogen to provide encapsulating material having hydrogen terminated carbon bonds, and contacting the vaporized material and said encapsulating material so that said encapsulating material forms a nanotube in-situ about said material.

2. The method of claim 1 wherein said molecular hydrogen is at a pressure below about 760 Torr.

3. The method of claim 1 wherein said vaporized material to be encapsulated and said vaporized material comprising carbon are vaporized in said molecular hydrogen by an electrical discharge between a cathode and anode.

4. The method of claim 3 wherein said anode comprises a first region comprising graphite and a second region comprising said material to be encapsulated.

5. The method of claim 4 wherein said anode second region includes an insert of said material to be encapsulated.

6. The method of claim 1 including the further step of removing the nanotube, leaving a nanowire comprising said material.

7. A method of forming a nanotube, comprising vaporizing a first material, vaporizing a material comprising carbon in the presence of at least 50 Torr of molecular hydrogen to provide encapsulating material having hydrogen terminated carbon bonds, and contacting the vaporized material and said encapsulating material so that said encapsulating material forms a nanotube in-situ about said material.

8. The method of claim 7 wherein said molecular hydrogen is at a pressure below about 760 Torr.

9. The method of claim 7 wherein said vaporized first material and said vaporized material comprising carbon are vaporized in said molecular hydrogen by an electrical discharge between a cathode and an anode.

10. The method of claim 9 wherein said anode comprises a first region comprising graphite and a second region comprising said material to be encapsulated.

11. The method of claim 10 wherein said anode includes an insert of said material to be encapsulated.

12. The method of claim 7 including the further step of removing the nanotube, leaving a nanowire comprising said material.

13. A method of claim 1 wherein said nanotube includes open ends.

14. A method of making a nanowire, comprising vaporizing a material to be encapsulated, vaporizing a second material for encapsulating said material, contacting the vaporized material and the vaporized second material to form a nanotube in-situ about said material, and removing the nanotube, leaving a nanowire comprising said material.

15. A method of making a nanowire, comprising vaporizing a first material to be encapsulated, vaporizing a second material for encapsulating said first material, contacting the vaporized first material and the vaporized second material to form a nanotube in-situ about said first material, and removing the nanotube, leaving a nanowire comprising said first material.

16. A method of encapsulating a material in a nanotube comprising vaporizing a material to be encapsulated selected from the group consisting of metals and semiconductor materials, providing encapsulating material having hydrogen terminated carbon bonds by vaporizing a material comprising a source of polycyclic aromatic hydrocarbons, and contacting the vaporized material to be encapsulated and said encapsulating material so that said encapsulating material forms a nanotube in-situ about said vaporized material to be encapsulated.

* * * * *